(12) United States Patent
Gattermann et al.

(10) Patent No.: US 9,046,579 B2
(45) Date of Patent: Jun. 2, 2015

(54) ELECTRIC ARC DISCHARGE EVALUATION METHOD, AND ASSOCIATED TEST STAND

(75) Inventors: Sven Gattermann, Zirndorf (DE); Ralf Kowalewski, Fürth (DE); Carsten Probol, Buckenhof (DE); Hans Tischmacher, Lauf (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 466 days.

(21) Appl. No.: 13/580,886

(22) PCT Filed: Feb. 2, 2011

(86) PCT No.: PCT/EP2011/051486
§ 371 (c)(1),
(2), (4) Date: Aug. 23, 2012

(87) PCT Pub. No.: WO2011/104084
PCT Pub. Date: Sep. 1, 2011

(65) Prior Publication Data
US 2012/0323372 A1  Dec. 20, 2012

(30) Foreign Application Priority Data
Feb. 24, 2010  (DE) .................. 10 2010 002 296

(51) Int. Cl.
*G01R 19/00* (2006.01)
*G01R 1/04* (2006.01)
(Continued)

(52) U.S. Cl.
CPC .............. *G01R 31/343* (2013.01); *G01M 13/04* (2013.01); *G01R 31/1227* (2013.01); *G01R 31/14* (2013.01)

(58) Field of Classification Search
CPC combination set(s) only.
See application file for complete search history.

(56) References Cited

U.S. PATENT DOCUMENTS 3,176,286 A  * 3/1965 Yuan-Heng Dschen ...... 340/682
3,831,160 A  * 8/1974 Cronin et al. ................ 340/515
(Continued)

FOREIGN PATENT DOCUMENTS

CH       646795 A5    12/1984
CN      2924697 Y     7/2007
(Continued)

OTHER PUBLICATIONS

Chen, S., Lipo, T.A., Fitzgerald, D., "Measurement and Analysis of Induction Motor Bearing Currents in PWM Inverter Drives", WEMPEC Research report, University of Wisconsin-Madison, WI, Jun. 1995, pp. 1-9.*
(Continued)

*Primary Examiner* — Robert Fennema
*Assistant Examiner* — Yagnesh J Trivedi
(74) *Attorney, Agent, or Firm* — Henry M. Feiereisen LLC.

(57) ABSTRACT

Electric arc discharges between bearing rings in a roller bearing are analyzed by setting a defined operating state based on rotational speed of the roller bearing, temperature of the roller bearing, an imbalance of the roller bearing causing vibrations, lubricants, axial/radial/tilt loads, tilting of the bearing rings relative to each other, pulse shape and pulse repetition rate of an applied electrical voltage, bearing play, and pre-existing damage to the roller bearing. A pulse-shaped electrical voltage between inner and outer bearing ring generates electric arc discharges, wherein for each electric arc discharge a characteristic value representative of energy, power, voltage and/or current and duration of the electric arc discharge is determined. Only those electric arc discharges are evaluated that have a qualifying value determined in accordance with at least one of the characteristic values greater than a predefined limit value.

14 Claims, 2 Drawing Sheets

(51) Int. Cl.
*G05B 15/00* (2006.01)
*G01R 31/34* (2006.01)
*G01M 13/04* (2006.01)
*G01R 31/12* (2006.01)
*G01R 31/14* (2006.01)

(56) References Cited

U.S. PATENT DOCUMENTS

| | | | | |
|---|---|---|---|---|
| 4,147,982 | A | * | 4/1979 | Emery .......................... 324/510 |
| 4,237,454 | A | * | 12/1980 | Meyer .......................... 340/682 |
| 4,511,837 | A | * | 4/1985 | Vermeiren et al. ............ 324/671 |
| 4,739,256 | A | | 4/1988 | Fletcher |
| 4,873,512 | A | * | 10/1989 | Miller .......................... 340/679 |
| 4,897,607 | A | * | 1/1990 | Grunewald et al. ........... 324/512 |
| 5,006,769 | A | * | 4/1991 | Posedel ........................ 318/434 |
| 5,485,491 | A | * | 1/1996 | Salnick et al. ................ 376/245 |
| 5,796,262 | A | * | 8/1998 | Bice ............................. 324/714 |
| 5,872,347 | A | * | 2/1999 | Li et al. ...................... 219/69.12 |
| 5,955,880 | A | | 9/1999 | Beam |
| 6,460,013 | B1 | * | 10/2002 | Nippes .......................... 702/183 |
| 6,727,725 | B2 | * | 4/2004 | Devaney et al. ......... 324/765.01 |
| 7,539,549 | B1 | | 5/2009 | Discenzo et al. |
| 8,315,826 | B2 | * | 11/2012 | Butz et al. ....................... 702/56 |
| 8,396,677 | B2 | * | 3/2013 | Hobelsberger et al. ......... 702/58 |
| 8,534,128 | B2 | * | 9/2013 | Murayama ...................... 73/593 |
| 2002/0083779 | A1 | * | 7/2002 | Narita et al. .............. 73/862.191 |
| 2005/0184751 | A1 | | 8/2005 | Hobelsberger |
| 2006/0167659 | A1 | * | 7/2006 | Miyasaka et al. .............. 702/185 |
| 2009/0302864 | A1 | * | 12/2009 | Marinov ....................... 324/557 |
| 2010/0180664 | A1 | | 7/2010 | Hiller et al. |
| 2011/0169504 | A1 | * | 7/2011 | Pekola et al. ................. 324/629 |

FOREIGN PATENT DOCUMENTS

| | | | |
|---|---|---|---|
| CN | 101308180 | A | 11/2008 |
| DE | 2616075 | A1 | 11/1977 |
| DE | 3941495 | A1 | 6/1990 |
| DE | 4132533 | A1 | 4/1993 |
| DE | 4441828 | A1 | 6/1995 |
| DE | 4410639 | A1 | 9/1995 |
| DE | 19844822 | A1 | 4/2000 |
| EP | 0632283 | A1 | 1/1995 |
| EP | 2244080 | A1 | 10/2010 |
| FR | 2408873 | A1 | 6/1979 |
| FR | 2573199 | A1 | 5/1986 |
| GB | 1462760 | A | 1/1977 |
| GB | 2096770 | A | 10/1982 |
| WO | WO 03060536 | A1 | 7/2003 |
| WO | WO 2004025811 | A2 | 3/2004 |
| WO | WO 2005034314 | A1 * | 4/2005 ............ H02K 11/00 |
| WO | WO 2008151176 | A1 | 12/2008 |
| WO | WO 2009063118 | A1 | 5/2009 |

OTHER PUBLICATIONS

Mohamed El Hachemi Benbouzid: A Review of Induction Motors Signature Analysis as a Medium for Faults Detection, IEEE Transactions on Industr.Electronics, IEEE Service Center, Piscataway, NJ.,USA., vol. 47, No. 5, Oct. 10, 2000; XP011023717; Magazine; 2000.

Tischmacher, H., Gattermann, S.: Bearing Currents in Converter Operation; XIX Intern. Conf. on Electrical MAchines, ICEM 2010, Rome; Piscataway, NJ., USA, Sep. 6, 2010, pp. 1-8; XP031779623; Magazine; 2010.

Navarro L. et al.: "Condition Monitoring System for Characterization of Electric Motor Ball Bearings with Distributed Fault Using Fuzzy Inference Tools", Instrumentation and Masurement Technology Conference I2MTC). 2010 (May 3, 2010) IEEE, Piscataway, JJ, USA, pp. 1159-1163.; Magazine; 2010.

Makarand S. Ballal et al.: "Adaptive Neural Fuzzy Inference System for the Detection of Inter-Turn Insulation and Bearing Wear Faults in Induction Motor", IEEE Transactions on Industr.Electronics, IEEE Service Center, Piscataway, NJ., USA, vol. 54, No. 1 (Feb. 1, 2007), pp. 250-258; XP011163568.; Magazine; 2007.

VMD Jagannath et al.: "WiBeaM: Wireless Bearing Monitoring System", Communication Systems Software and Middleware, 2007. 2nd. Intern.Conference onComsware 2007; IEEE, PI. (Jan. 1, 2007), pp. 1-8; XP031113948.; Magazine; 2007.

Paul S. Hamer: "Acceptance Testing of Electric Motors and Generators", 198810002; 19881002-198810007, Oct. 2, 1988; pp. 1291-1304; XP 010519250.; Magazine; 1988.

Har, Prashad,: "Effect of operating parameters on the threshold voltages and impedance response of non-insulated rolling element bearings under the action of electrical currents" Wear; vol. 117; No. 2; pp. the description, pp. 224, lines 13-16 and lines 32-37, pp. 225, paragraphs 1 and 2, pp. 226, lines 5-12, and Fig. 1; IN; Jul. 8, 1986.

Liang, Pengpeng et al.: "Development of Test Prototype of Rolling Bearing Fault Diagnosis and Research and Development of Variable Load and Variable Speed Simulation Test System for Bearing", China Master's Theses Full-text Database, Engineering Technology; vol. 2; No. 7 and 9; pp. the description, p. 26, p. 49, and figure 4.1, the whole text; CN; Jul. 15, 2008.

* cited by examiner

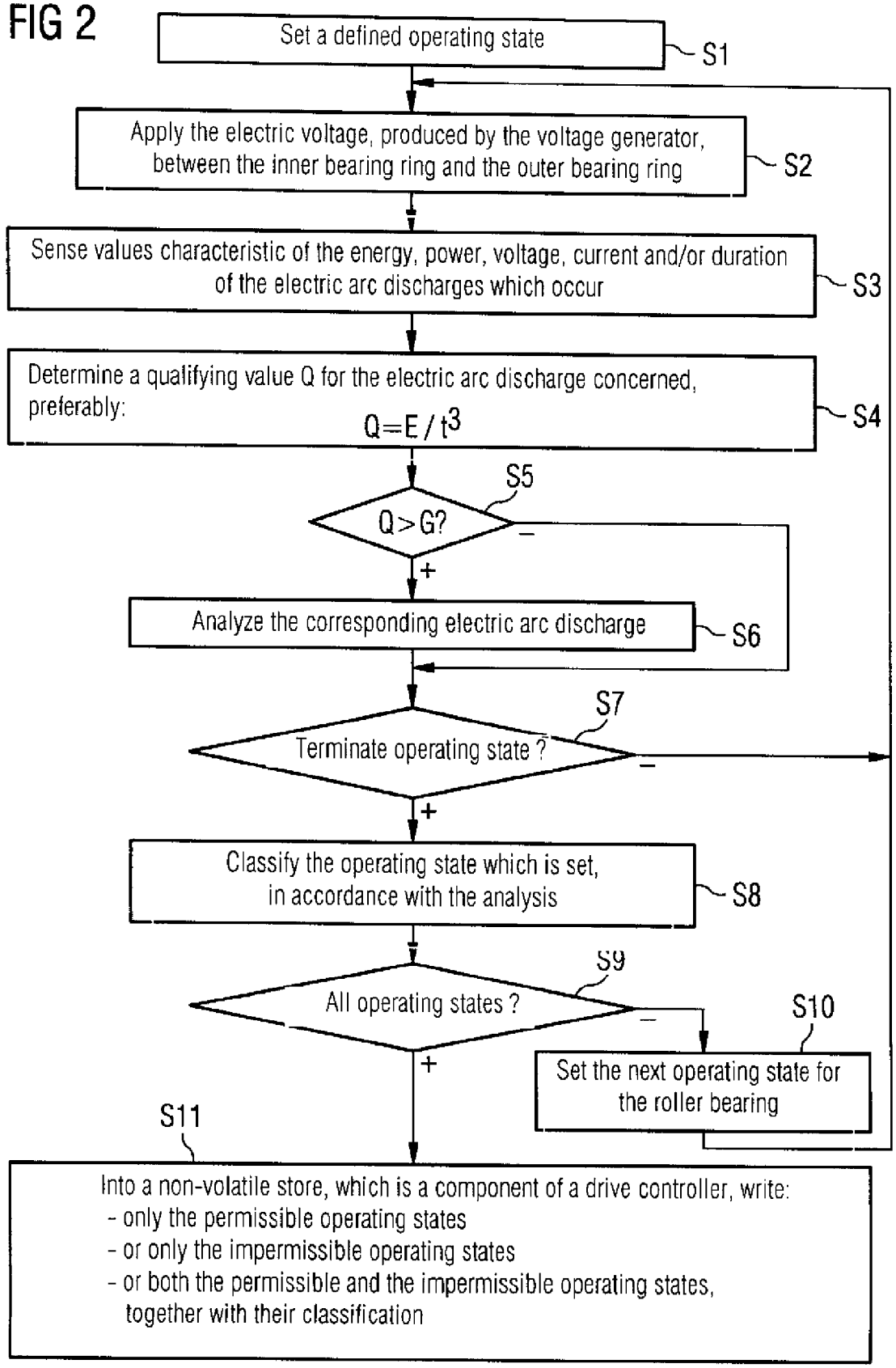

US 9,046,579 B2

ELECTRIC ARC DISCHARGE EVALUATION METHOD, AND ASSOCIATED TEST STAND

CROSS-REFERENCES TO RELATED APPLICATIONS

This application is the U.S. National Stage of International Application No. PCT/EP2011/051486, filed Feb. 2, 2011, which designated the United States and has been published as International Publication No. WO 2011/104084 and which claims the priority of German Patent Application, Serial No. 10 1010 002 296.9, filed Feb. 24, 2010, pursuant to 35 U.S.C. 119(a)-(d).

BACKGROUND OF THE INVENTION

The present invention relates to a method of analysis for electric arc discharges which occur between an inner ring of a bearing and an outer ring of the bearing.

The present invention relates further to a test stand for a roller bearing which has an inner bearing ring, an outer bearing ring, and roller elements which roll around between the inner bearing ring and the outer bearing ring.

In the case of motors which are powered by converters, parasitic effects arise which manifest themselves by a current flow through the motor bearing. As a consequence electric arc discharges can occur, through the bearing's lubricating film, which in the extreme case can lead to melting of the materials and thus to changes in the bearing race. These changes can in the long term lead to damage of the bearing, which can extend to a total failure of the bearing.

For the purpose of detecting electric arc discharges and the bearing currents, until now in the prior art measurements have only been carried out on the complete drive system, consisting of the converter and the motor. With this approach, exercising an influence over the roller bearing's operating parameters in isolation is not possible. The operating state of the roller bearing establishes itself "somehow" on the basis of the external conditions. Parameter trials, in which whole arrays of characteristic values are selectively run through, cannot be carried out in this way.

With the prior art, in order to be able to obtain an order of magnitude for the damage to the roller bearing which might be caused by the electric arc discharges, the current density of the electric arc discharges is sensed. However, this leads only to unsatisfactory correlations between the loading on the roller bearing from the electric arc discharges, on the one hand, and on the other hand the damage to the roller bearing caused thereby.

A range of parameters are responsible for the development of bearing damage. On the one hand these include, of course, the bearing current and the associated bearing voltage. On the other hand, they include further parameters, for example the mechanical and thermal operating state of the bearing. Rotational speed, mechanical vibration, temperature etc. influence the thickness of the lubricating film, and with it the probability of an electrical arc discharge. In order to be able to determine what influence the individual parameters have on the electric arc discharge, and the bearing damage associated with it, it is necessary to be able to control these parameters in isolation. Only in this way can possible dependencies, through to permissible limiting values, be determined.

A method for diagnosing journal bearings by means of magnetic field measurements is known from DE 44 41 828 A1. In the case of this method, a current is injected into the machine shaft. The leakage current through the bearing is determined from a measurement of the difference in the current which flows in the shaft before the bearing and after the bearing. The injected current is an alternating current. For the purpose of determining the currents, the magnetic fields produced by the currents are measured.

From US 2005/184 751 A1, a method is known for the detection of sparking activity in an electric machine. With this method, the shaft voltage and/or the shaft current is measured and analyzed for the purpose of sensing the sparking activity. The sparking activity can be shaft-eroding sparks which occur between parts of the shaft bearings.

From DE 44 10 639 A1, a test stand for a roller bearing is known, wherein the roller bearing has an inner bearing ring, an outer bearing ring and roller elements which roll around between the inner bearing ring and the outer bearing ring. The test stand has a base body which, on the one hand, has a mounting arrangement in which the roller bearing can be removably mounted. The test stand has in addition an electric drive, the rotational speed of which can be altered, which is arranged in a fixed location on the base body and acts on a shaft which, when the roller bearing is mounted, has a non-rotating joint to the inner bearing ring or to the outer bearing ring. With this test stand, purely mechanical testing is carried out on the roller bearing.

Under DE 198 44 822 A1, limiting values specifying the maximum permissible accelerations of a motor vehicle are stored in a non-volatile memory in a drive controller for an internal combustion engine (specifically: a car engine), as a function of the gear which is currently selected.

A first object of the present invention consists in devising a method for analyzing electric arc discharges between the inner bearing ring and the outer bearing ring of a roller bearing, which permits—unlike the prior art: reliable—predictions about bearing damage induced or not induced by the electric arc discharges.

A second object of the present invention consists in devising an appropriate test stand by means of which the above mentioned analysis method can be carried out.

SUMMARY OF THE INVENTION

In the case of the inventive analysis method, provision is made that,
a defined operating state of the roller bearing is set,
for the purpose of setting the defined operating state, at least one of the following parameters is set: rotational speed of the roller bearing; temperature of the roller bearing; an imbalance which causes vibrations imposed on the roller bearing; the lubricants; axial, radial, tilting loads; tilting of the inner bearing ring relative to the outer bearing ring; the pulse shape and pulse repetition frequency of the applied electrical voltage; bearing play and pre-existing damage to the roller bearing,
in the defined operating state, a plurality of electric arc discharges is generated by applying a pulse-shaped electrical voltage between the inner bearing ring and the outer bearing ring,
for each electric arc discharge, at least one value is sensed which is characteristic of the energy, the power, the voltage, the current and/or the duration of the electric arc discharge concerned, and
only those electric arc discharges are analyzed for which a qualifying value, determined as a function of at least one of the characteristic values sensed for the electric arc discharge concerned, lies above a predefined limiting value.

The inventive solution is based on the view that what matters is not the electric arc discharge per se. Rather, what matters is at least one characteristic value of the electric arc discharge. What matters, in particular, is the volume over which the energy of the electric arc discharge concerned is distributed. Bearing damage only occurs if the volume density of the energy input by the electric arc discharge leads to the vaporization of material.

The energy input by the electric arc discharge into the inner bearing ring or the outer bearing ring, as applicable, is essentially propagated at the speed of sound in the material concerned. Furthermore, the propagation wave has an essentially hemispherical shape. Its radius is equal to the product of the duration of the electric arc discharge and the speed of sound in the material of the inner bearing ring or outer bearing ring, as applicable. The qualifying value is thus dependent not only on the energy in the electric arc discharge concerned, but also on its duration. Particularly good values have been obtained in practical trials when the qualifying value is proportional to the energy and inversely proportional to the cube of the duration of the electric arc discharge concerned.

The predetermined limiting value can be determined in any desired way, in particular experimentally. The predefined limiting value will preferably be determined with reference to the material of which the inner bearing ring and/or the outer bearing ring consist, by the heating enthalpy which is required in order to heat up the material from the operating temperature to the melting point temperature, by the enthalpy of fusion which is required in order to melt the material, and by the heating enthalpy which is required in order to heat up the material from its melting point temperature up to its boiling point temperature, wherein the enthalpies cited are relative to the same volume. In particular, material vaporization will occur if the volume-specific energy of the electric arc discharge exceeds the enthalpy which is given by the sum of the enthalpies cited.

If this enthalpy is exceeded, vaporization of material will take place. Indeed, if the volume-specific energy is greater than the above total plus the enthalpy of vaporization, which is required to vaporize the material, then even complete vaporization of the corresponding volume will take place.

In order to be able to make predictions for (almost) any desired operating states, the analysis method is repeated for a plurality of operating states of the roller bearing. For each operating state, the frequency of the electric arc discharges which are being analyzed is determined. The operating states are classified as permissible or impermissible, as a function of the frequency determined for the operating state concerned. In particular, operating states in which absolutely no electric arc discharges occur, or only a few "critical" ones (i.e. electric arc discharges for which the qualifying value lies above the predefined limiting value), are classified as permissible, operating states in which many critical electric arc discharges occur as impermissible. If necessary, intermediate levels such as for example "critical but permissible for short periods" or "permissible for a limited time", are also possible.

The number of parameters which can be varied for the roller bearing can be determined as required.

The inventive analysis method can, for example, be used to write into a non-volatile memory, which is part of a drive controller for a converter-powered electric motor having a roller bearing
   either solely those operating states of the roller bearing which are classified as permissible
   or solely those operating states of the roller bearing which are classified as impermissible
   or both those operating states of the roller bearing which are classified as permissible and also those operating states of the roller bearing which are classified as impermissible, together with their classification in each case.

In this case, the drive controller can itself recognize during ongoing operation whether a bearing-damaging operating state of the roller bearing exists or is threatened, and can if necessary initiate appropriate measures. Two examples:
   In a particular rotational speed range, vibrations occur which lead to critical electric arc discharges. The drive controller attempts to avoid this rotational speed range, if possible. For example, an appropriate warning message can be output to an operator of a machine controller if the requested mode of operation of the machine will produce rotational speeds in the corresponding range. It is also possible for the drive controller to actuate the motor with the maximum motor torque when accelerating and braking, that is in those cases where the rotational speed range concerned cannot be avoided, in order to pass through the critical rotational speed range as quickly as possible.
   In a particular operating state, critical electric arc discharges occur when the drive is subjected to more than 80% of its full operating current. The drive controller limits the operating current to a maximum of 75% of the full operating current.

The present invention therefore relates also to a drive controller for a converter-powered electric motor which has a roller bearing, with a non-volatile memory into which are written
   either solely those operating states of the roller bearing which are classified as permissible
   or solely those operating states of the roller bearing which are classified as impermissible
   or both those operating states of the roller bearing which are classified as permissible and also those operating states of the roller bearing which are classified as impermissible, together with their classification in each case.

The critical factor here, however, is that the operating states written into the non-volatile memory have been determined in accordance with an analysis method in accordance with the invention, and that the operating states in each case include at least one of the parameters: rotational speed of the roller bearing; temperature of the roller bearing; an imbalance which causes vibrations imposed on the roller bearing; the lubricants; axial, radial, tilting loads; tilting of the inner bearing ring relative to the outer bearing ring; the pulse shape and pulse repetition frequency of the applied electrical voltage; bearing play and pre-existing damage to the roller bearing.

In accordance with the invention, the test stand mentioned in the introduction is developed in that,
   the test stand has a base body,
   the base body has a mounting arrangement in which the roller bearing can be removably mounted,
   the mounting arrangement consists of an electrically insulating material and/or is electrically insulated from the remainder of the base body by an intermediate element consisting of an electrically insulating material,
   the test stand has in addition an electric drive, the rotational speed of which can be altered, which is arranged in a fixed location on the base body and acts on a shaft which, when the roller bearing is mounted, has a non-rotating joint to the inner bearing ring or to the outer bearing ring,
   the electric drive is electrically insulated from the roller bearing,
   the test stand has a voltage generator, using which the interface between the inner bearing ring and the outer bearing ring can be subjected to a pulse-shaped electric voltage with an adjustable pulse shape and pulse repetition frequency, and the test stand has measuring device by means of which it is possible to sense at least one value which is characteristic of the energy, the power, the voltage, the current and/or the duration of electric arc discharges which occur between the inner bearing ring and the outer bearing ring.

Preferably, there is arranged on the shaft a loading bearing, by means of which a static and/or dynamic loading can be applied to the roller bearing. For example, the test stand can have a hydraulic system which works on the loading bearing to apply the static and/or dynamic loading. The load which can be applied to the roller bearing may be axial, radial and/or asymmetric in its effect.

It is further preferable that there is an imbalance disk arranged on the shaft, by means of which an imbalance which causes vibrations can be applied to the roller bearing. For this purpose, the imbalance disk can have at least one retaining fixture for holding an imbalance weight.

In a further preferred embodiment of the test stand, provision is made that the test stand has at least one facility for affecting the temperature, for the purpose of actively setting an operating temperature for the roller bearing. Alternatively, or additionally, the test stand can have an adjustment fixture, for tilting the inner bearing ring relative to the outer bearing ring. Alternatively, or additionally, acceleration sensors can be arranged on the mounting arrangement, by means of which horizontal and/or vertical accelerations of the mounting arrangement can be sensed.

BRIEF DESCRIPTION OF THE DRAWING

Further advantages and details are revealed by the following description of exemplary embodiments in conjunction with the drawings. These show, as block diagrams, in.

DETAILED DESCRIPTION OF PREFERRED EMBODIMENTS

Figure 1:
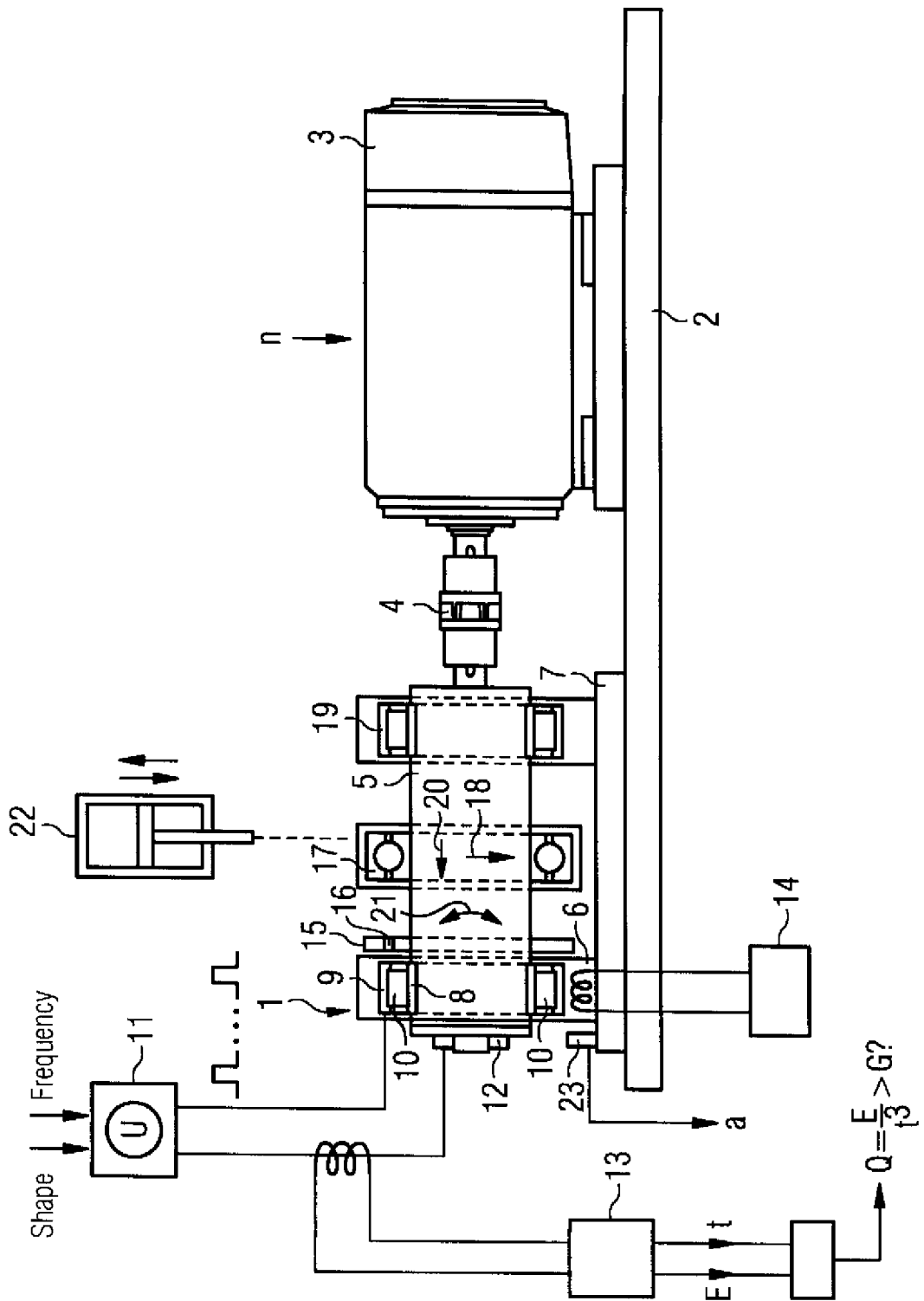
FIG. 1 schematically, a test stand for a roller bearing, and
FIG. 2 schematically, an analysis method for electric arc discharges.

As shown in FIG. 1, a test stand for a roller bearing 1 has a base body 2. Arranged in a fixed location on the base body 2 is (among other items) an electric drive 3. At least the rotational speed of the electric drive 3 can be regulated; frequently it is also possible to regulate the torque. The electric drive 3 works on a shaft 5. A coupling 4 can be arranged between the electric drive 3 and the shaft 5.

The electric drive 3 is electrically insulated from the roller bearing 1. For this purpose the coupling 4 can, for example, consist of an electrically insulating material.

The base body 2 has a mounting arrangement 6. The mounting arrangement 6 can consist of an electrically insulating material. Alternatively or in addition, there may be an intermediate element 7 which consists of an electrically insulating material and by which the mounting arrangement 6 is electrically insulated from the remainder of the base body 2. The roller bearing 1 can be removably mounted in the mounting arrangement 6.

The roller bearing 1 has—as is generally the case—an inner bearing ring 8 and an outer bearing ring 9 together with roller elements 10. When the roller bearing 1 is in operation, the roller elements 10 roll around between the inner bearing ring 8 and the outer bearing ring 9. When the roller bearing 1 is in its mounted state in the mounting arrangement 6, one of the bearing rings 8, 9—generally the outer bearing ring 9—is held in a fixed position. When the roller bearing 1 is mounted, the other of the bearing rings 8, 9—generally the inner bearing ring 8—has a non-rotating joint to the shaft 5.

The test stand has in addition a voltage generator 11. Using the voltage generator 11, an electric voltage U can be applied to the roller bearing 1. In particular, as shown in the diagram in FIG. 1, one of the two outputs from the voltage generator 11 is connected to the inner bearing ring 8 and the other to the outer bearing ring 9. The connection to the bearing ring 8 (generally the inner bearing ring 8) which has a non-rotating joint to the shaft 5 can be effected, for example, by means of a slip ring 12. By the voltage generator 11 being electrically connected to both bearing rings 8, 9, the result is that the electric voltage U output by the voltage generator 11 is applied across the interface between the inner bearing ring 8 and the outer bearing ring 9.

The voltage generator 11 can be designed as required. The voltage generator 11 will preferably be designed in such a way that the electric voltage U produced by the voltage generator 11 is, as shown in FIG. 1, pulse-shaped. The shape of the voltage pulse produced by the voltage generator 11 (rise time, height, holding time, fall time) is adjustable. The pulse repetition frequency is also adjustable. For example, the voltage generator 11 can incorporate a function generator, downstream from which is a power amplifier.

Because of the voltage pulses applied, electric arc discharges can occur between the inner bearing ring 8 and the outer bearing ring 9. For the purpose of sensing characteristic values of the electric arc discharges—in particular their energy E and/or their duration t—the test stand has (at least) one appropriate measuring device 13.

The values sensed by means of the measuring device 13 can be determined as required. For example, it is possible to sense the waveforms over time of the voltage difference which exists between the inner bearing ring 8 and the outer bearing ring 9, or the current flowing through the roller bearing 1. In particular, a voltage dip or a rise in current, as applicable, can be taken as an indication of an electric arc discharge. The waveforms over time mentioned can, for example, be displayed and stored by means of an appropriately fast storage oscilloscope.

It is also possible to sense other variables. For example, it is possible to sense a frequency spectrum of the electromagnetic noises generated by the electric arc discharges, or the waveform over time of the electric and/or magnetic fields generated. The power of the electric arc discharges can also be sensed.

The inventive test stand is operated as shown in FIG. 2, as follows.

First, in a step S1, a defined operating state of the roller bearing 1 is set. The setting options are discussed later in more detail. Then, in a step S2, the electric voltage U produced by the voltage generator 11 is applied between the inner bearing ring 8 and the outer bearing ring 9. In a step S3, the characteristic values—preferably for the energy E and the duration t—are sensed for the electric arc discharges which occur.

In a step S4, a qualifying value Q for the electric arc discharge concerned is determined—automatically or manually. The qualifying value Q is determined, as part of step S4, as a function of the characteristic values sensed for the electric arc discharge concerned. The determination will preferably be made as a function of the energy E and the duration t of the electric arc discharge concerned. In particular, the determination can be made in accordance with the relationship $$Q=E/t^3.$$

In a step S5, a check is made as to whether the qualifying value Q lies above a predefined limiting value G. If so, the corresponding electric arc discharge is analyzed in a step S6. In the simplest case, a counter is incremented for this purpose. Otherwise, step S6 is skipped over.

The limiting value G can be determined as required. In particular, the limiting value G can be determined by the enthalpies, cited in the introductory description, of the material of which the inner bearing ring 8 and/or the outer bearing ring 9 consist. To avoid repetition, the reader is referred to the appropriate expositions in the introductory description.

In a step S7, a check is made as to whether the operating state set in step S1 should be terminated. If not, the method returns to step S2. Otherwise the method moves on to step S8. The decision criterion in step S7 can be determined as required. In the simplest cases, the decision criterion is the expiry of a time, the output of a predefined number of pulses from the voltage generator 11, or the input of a termination instruction by a user.

In step S8, the operating state set in step S1 is classified in accordance with the analysis of step S6. This classification will contain at least the levels "permissible" and "impermissible". If necessary, there can be additional intermediate levels, for example the intermediate level "permissible but critical" or the intermediate level "only permissible for short periods". In the simplest case, the levels will be set as a function of the number (=frequency) of the electric arc discharges, as totaled up in step S6.

In a step S9, a check is made on whether all of the operating states have now been run through. If not, the method moves on to step S10, in which the next operating state of the roller bearing 1 is set.

Preferably, a step S11 is present in addition. However, step S11 is only optional, that is it is not a mandatory requirement. If step S11 is present, operating states are written into a non-volatile memory which is a component of a drive controller. In doing so, it is possible that only the permissible operating states are written into the memory, but not the other operating states. In this case it is possible that the additional information, that these operating states are permissible, is present. However, this is not absolutely necessary, because the permissibility of the operating states is already indicated by the fact these operating states have been written into the memory.

In an analogous way, it is possible to write into the memory only the impermissible operating states. Again in this case, the additional information that these operating states are permissible can be written into the memory. However, this is no longer necessary.

Preferably, both the permissible and also the impermissible operating states will be written into the memory. In this case, they must be written in together with their classification. This can be effected in that their classification is assigned to each of the individual operating states. In this case, the appropriate classification will be individually assigned to each individual operating state. Alternatively, the operating states can be grouped according to their individual classifications. It is of secondary importance which of the detailed approaches is utilized. The critical point is that it must be possible to determine retrospectively which operating state has which classification.

In the context of FIG. 2, a plurality of operating state is set. For each operating state, the steps S2 to S8 are run through.

For the purpose of setting the plurality of operating states of the roller bearing 1, a plurality of parameters can be varied. Listed below are some of the possible variations. Combinations are of course possible.

Thus, for example, the rotational speed n of the roller bearing 1 can be varied. This variation is effected—of course—by appropriate actuation of the electric drive 3.

Alternatively or additionally, the temperature of the roller bearing 1 can be varied. For this purpose, the test stand has if necessary (at least) one temperature-control device 14, by means of which the operating temperature of the roller bearing 1 can be actively set. As a rule, the temperature-control device 14 will be designed, as shown in FIG. 1, as a heating device. In individual cases, however, a design as a cooling device is also possible.

Alternatively or additionally, an imbalance which is imposed on the roller bearing 1 can be varied. The imbalance causes mechanical vibrations. For the purpose of varying the imbalance an imbalance disk 15, for example, can be arranged on the shaft 5, by means of which an imbalance can be applied to the roller bearing 1. The imbalance disk 15 can have a retaining fixture 16. The retaining fixture 16 serves to hold an imbalance weight (not shown in FIG. 1).

Alternatively, a lubricant, which is used to lubricate the roller bearing 1, can be varied. Possible variations which can be considered in this case are, in particular, the composition and the age of the lubricant.

Alternatively or additionally, the loading on the roller bearing 1 can be varied. For example, a loading bearing 17 can be arranged on the shaft 5, by means of which a loading can be applied to the shaft 5 and thereby indirectly on the roller bearing 1. The loading can alternatively be static, dynamic or—similarly to the overlaying of a d.c. and an a.c. voltage—a combination of static and dynamic.

The nature of the loading and the way it is applied to the loading bearing 17, can be chosen as required. For example, a radial loading corresponding to the arrow 18 can be applied. In this case, the shaft 5 should preferably be mounted in a further roller bearing 19 in addition to the roller bearing 1. If the further roller bearing 19 is present, the further roller bearing 19 should be electrically insulated from the roller bearing 1 and/or from the remainder of the test stand.

Alternatively, an axial loading can be applied as shown by the arrow 20. In this case, the further roller bearing 19 may be present. However, this is not necessary. As yet another alternative, a tilting load can be applied, as shown by the arrow 21. In this case the further roller bearing 19 should preferably not be present, because otherwise the shaft 5 could not be tilted, or only to a small extent.

If the roller bearing 1 has only a relatively small bearing play, the tilting of the shaft 5 has the effect that the tilting load cited is applied to roller bearing 1. On the other hand, if the roller bearing 1 has a sufficiently large bearing play, the inner bearing ring 8 tilts relative to the outer bearing ring 9 in an essentially force-free way. Hence the tilting of the inner bearing ring 8 relative to the outer bearing ring 9 and the bearing play are also adjustable parameters of the roller bearing 1. The loading bearing 17 can thus also be used for tilting the inner bearing ring 8 relative to the outer bearing ring 9.

The nature of the loading and the way it is applied to the loading bearing 17, can also be chosen as required. For example, to apply a static and/or dynamic loading to the loading bearing 17, the test stand can have a hydraulic system 22 which works on the loading bearing 17. The hydraulic system 22 can, in particular, be embodied as a hydraulic cylinder unit, as shown in FIG. 1. The loading bearing 17 should also be electrically insulated from the roller bearing 1 and/or from the hydraulic system 22.

It has already been mentioned that the pulse shape and the pulse repetition frequency of the applied electrical voltage U can be varied. By varying these values, a simulation of the electrical loading on the roller bearing 1 in a converter-powered motor can be simulated.

A further adjustable parameter is pre-existing damage to the roller bearing 1, for example by a corresponding indentation.

The measuring device 13 for sensing the values characteristic of the energy E and the duration t of the electric arc discharge represents the minimum sensing technology equipment for the test stand. In general, further sensors will be present. In particular there can be, arranged on the mounting arrangement 6, acceleration sensors 23 by means of which the horizontal and/or vertical accelerations a of the mounting arrangement 6 can be sensed.

The present invention has many advantages. In particular, it is possible using the inventive test stand to investigate almost any desired operating states of the roller bearing 1 for their damaging effects in terms of pitting due to bearing currents. Furthermore, by storing away the permissible and/or impermissible operating states in the drive controller's non-volatile memory it is possible to effect automated consideration of these states in ongoing operation of the drive which is controlled by the drive controller. For the sake of good order, attention is called to the fact that this drive is not the electrical drive 3 of the test stand, but rather it is that drive for which the roller bearing 1 is actually intended.

The above description is solely for the purpose of explaining the present invention. The scope of protection for the present invention is, on the other hand, to be determined solely by the attached claims.

The invention claimed is:

1. A method for analyzing electric arc discharges taking place between an inner bearing ring and an outer bearing ring in a roller bearing, comprising the steps of:
    a) setting a defined operating state of the roller bearing by setting at least one of the following parameters: rotational speed of the roller bearing, temperature of the roller bearing, an imbalance of the roller bearing causing vibrations, lubricants, axial loads, radial loads, tilt loads, tilting of the inner bearing ring relative to the outer bearing ring, pulse shape and pulse repetition rate of an applied electrical voltage, bearing play, and pre-existing damage to the roller bearing,
    b) generating, in the defined operating state, a plurality of electric arc discharges by applying a pulse-shaped electrical voltage between the inner bearing ring and the outer bearing ring,
    c) measuring, for each electric arc discharge, at least one characteristic value representative of at least one of energy, power, voltage, current and duration of the electric arc discharge,
    d) determining a qualifying value as a function of the at least one characteristic value, and
    e) evaluating only those electric arc discharges having a qualifying value greater than a predefined limit value,
    wherein the qualifying value is proportional to the energy and inversely proportional to a third power of the duration of the electric arc discharge.

2. The method of claim 1, wherein the predefined limit value is determined with reference to a material of which the inner bearing ring or the outer bearing ring is made, by a heating enthalpy required for heating the material from an operating temperature of the roller bearing to a melting temperature of the material, by a melting enthalpy required for melting the material, and by a heating enthalpy required for heating the material from the melting temperature to a boiling temperature of the material, wherein the enthalpies relate to an identical volume of the material.

3. The method of claim 1, and further comprising:
    repeating steps a) through e) to set additional defined operating states of the roller bearing,
    determining for each defined operating state a frequency of occurrence of electric arc discharges to be analyzed, and
    classifying the defined operating states as permissible or impermissible depending on the determined frequency of occurrence.

4. The method of claim 3, and further comprising writing into a non-volatile memory, which is part of a drive controller for a converter-powered electric motor having the roller bearing,
    either solely those defined operating states which are classified as permissible,
    or solely those defined operating states which are classified as impermissible,
    or both those defined operating states which are classified as permissible as well as those defined operating states which are classified as impermissible, in conjunction with a classification of each defined operating state.

5. A drive controller for a converter-powered electric motor having a roller bearing, the drive controller comprising:
    a non-volatile memory having stored therein classified operating states of the roller bearing, wherein the classified operating states are determined from defined operating states of the roller bearing which include at least one of the following parameters:
rotational speed of the roller bearing, temperature of the roller bearing, an imbalance of the roller bearing causing vibrations, lubricants, axial loads, radial loads, tilt loads, tilting of the inner bearing ring relative to the outer bearing ring, pulse shape and pulse repetition rate of an applied electrical voltage, bearing play, and pre-existing damage to the roller bearing,
    wherein the stored classified operating states include only operating states classified as permissible, or only operating states classified as impermissible operating states, or operating states classified as both permissible and impermissible, in which case a classification of each operating state is also stored,
    wherein the permissible or impermissible operating states are determined by:
    a) setting a defined operating state of the roller bearing by setting at least one of the parameters,
    b) generating, in the defined operating state, a plurality of electric arc discharges by applying a pulse-shaped electrical voltage between the inner bearing ring and the outer bearing ring,
    c) measuring, for each electric arc discharge, at least one characteristic value representative of at least one of energy, power, voltage, current and duration of the electric arc discharge,
    d) determining a qualifying value as a function of the at least one characteristic value, and
    e) evaluating only those electric arc discharges having a qualifying value greater than a predefined limit value, and
    repeating steps a) through e) to set additional defined operating states of the roller bearing,
    determining for each defined operating state a frequency of occurrence of electric arc discharges to be analyzed, and classifying the defined operating states as permissible or impermissible depending on the determined frequency of occurrence,
wherein the qualifying value is proportional to the energy and inversely proportional to a third power of the duration of the electric arc discharge.

6. A test stand for a roller bearing, said roller bearing having an inner bearing ring, an outer bearing ring and roller elements disposed between the inner bearing ring and the outer bearing ring, wherein either the inner bearing ring or the outer bearing ring is mounted on a shaft with a rotation lock, the test stand comprising:
- a base body having a mounting arrangement, in which the roller bearing is removably mounted, with the mounting arrangement being made of an electrically insulating material or being electrically insulated from a remainder of the base body by an intermediate element made of an electrically insulating material,
- a variable rotation-speed electric drive electrically insulated from the roller bearing and arranged at a fixed location on the base body and operating on the shaft,
- a voltage generator configured for applying a pulse-shaped electric voltage with an adjustable pulse shape and pulse repetition rate to a junction between the inner bearing ring and the outer bearing ring, and
- a measuring device for measuring at least one characteristic value representative of at least one of energy, power, voltage, current and duration of the electric arc discharge taking place between the inner bearing ring and the outer bearing ring in response to the applied pulse-shaped electric voltage, wherein a qualifying value, determined as a function of the at least one characteristic value, is proportional to the energy and inversely proportional to a third power of the duration of the electric arc discharge and only those electric arc discharges are analyzed for which a qualifying value lies above a predefined limiting value.

7. The test stand of claim 6, further comprising a loading bearing arranged on the shaft and configured to apply at least one of a static load and a dynamic load to the roller bearing.

8. The test stand of claim 7, further comprising a hydraulic system which applies the static or dynamic load to the loading bearing.

9. The test stand of claim 7, wherein the static or dynamic load is applied to the roller bearing axially, radially or asymmetrically, or in combination thereof.

10. The test stand of claim 7, further comprising an imbalance disk arranged on the shaft for applying an imbalance to the roller bearing to cause vibrations.

11. The test stand of claim 10, wherein the imbalance disk comprises at least one retaining fixture for holding an imbalance weight.

12. The test stand of claim 6, further comprising at least one temperature control device for actively setting an operating temperature for the roller bearing.

13. The test stand of claim 6, further comprising an adjustment fixture for tilting the inner bearing ring relative to the outer bearing ring.

14. The test stand of claim 6, further comprising acceleration sensors arranged on the mounting arrangement for measuring at least one of a horizontal and a vertical acceleration of the mounting arrangement.

* * * * *